(12) United States Patent
Lim et al.

(10) Patent No.: US 11,531,268 B2
(45) Date of Patent: Dec. 20, 2022

(54) POSITIVE-WORKING PHOTORESIST COMPOSITION, PATTERN PRODUCED THEREFROM, AND METHOD FOR PRODUCING PATTERN

(71) Applicant: LG CHEM, LTD., Seoul (KR)

(72) Inventors: Min Young Lim, Daejeon (KR); Tae Seob Lee, Daejeon (KR); Ji Hye Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 358 days.

(21) Appl. No.: 16/498,829

(22) PCT Filed: Jul. 25, 2018

(86) PCT No.: PCT/KR2018/008431
§ 371 (c)(1),
(2) Date: Sep. 27, 2019

(87) PCT Pub. No.: WO2019/027181
PCT Pub. Date: Feb. 7, 2019

(65) Prior Publication Data
US 2021/0011379 A1    Jan. 14, 2021

(30) Foreign Application Priority Data
Jul. 31, 2017   (KR) .................. 10-2017-0097280

(51) Int. Cl.
*G03F 7/039* (2006.01)
*G03F 7/30* (2006.01)
*G03F 7/033* (2006.01)

(52) U.S. Cl.
CPC .......... *G03F 7/0397* (2013.01); *G03F 7/033* (2013.01); *G03F 7/039* (2013.01); *G03F 7/0392* (2013.01); *G03F 7/30* (2013.01)

(58) Field of Classification Search
CPC .......... G03F 7/039; G03F 7/0392; G03F 7/20; G03F 7/0397; G03F 7/30
See application file for complete search history.

(56) References Cited

U.S. PATENT DOCUMENTS

| 4,731,319 | A | 3/1988 | Kohara et al. |
| 5,340,686 | A | 8/1994 | Sakaguchi et al. |
| 5,372,912 | A | 12/1994 | Allen et al. |

(Continued)

FOREIGN PATENT DOCUMENTS

| CN | 1688939 A | 10/2005 |
| CN | 1804729 A | 7/2006 |

(Continued)

OTHER PUBLICATIONS

PCT Search Report & Written Opinion issued for PCT/KR2018/008431 dated Nov. 2, 2018, 10 pages.

*Primary Examiner* — John S Chu
(74) *Attorney, Agent, or Firm* — Rothwell, Figg, Ernst & Manbeck, P.C.

(57) ABSTRACT

The present invention provides a positive photoresist composition having excellent storage stability, sensitivity, developing properties, plating resistance, and heat resistance. More specifically, a specific dissolution inhibitor in the form of an oligomer having the same repeating unit structure as the resin contained in the photoresist composition is applied to said composition.

18 Claims, 1 Drawing Sheet

(56) References Cited

U.S. PATENT DOCUMENTS

| | | |
|---|---|---|
| 5,939,234 A | 8/1999 | Yamanaka et al. |
| 6,265,135 B1 | 7/2001 | Kodama et al. |
| 2005/0131184 A1 | 6/2005 | Yamagishi et al. |
| 2005/0271972 A1 | 12/2005 | Nishiwaki et al. |
| 2006/0154166 A1 | 7/2006 | Tsunemi et al. |
| 2006/0228644 A1 | 10/2006 | Chen et al. |
| 2009/0023102 A1 | 1/2009 | Shimbori et al. |
| 2010/0331439 A1 | 12/2010 | Heo et al. |
| 2012/0006788 A1 | 1/2012 | Fujimori et al. |
| 2013/0056653 A1 | 3/2013 | Hatakeyama et al. |
| 2013/0171572 A1* | 7/2013 | Washio .................. G03F 7/20 430/325 |
| 2015/0355543 A1 | 12/2015 | Takemura et al. |
| 2016/0209747 A1 | 7/2016 | Yamaguchi et al. |
| 2016/0291466 A1* | 10/2016 | Sugihara .................. G03F 7/30 |
| 2016/0291467 A1* | 10/2016 | Sugihara ............... G03F 7/0045 |
| 2017/0253780 A1 | 9/2017 | Wang et al. |
| 2018/0009775 A1 | 1/2018 | Tanaka et al. |
| 2018/0094118 A1 | 4/2018 | Oota et al. |
| 2021/0356863 A1* | 11/2021 | Kuroiwa .................. G03F 7/40 |

FOREIGN PATENT DOCUMENTS

| | | |
|---|---|---|
| CN | 101998947 A | 3/2011 |
| CN | 106019832 A | 10/2016 |
| EP | 1 642 932 B1 | 3/2012 |
| JP | 1993-173333 A | 7/1993 |
| JP | 1994-054384 B2 | 7/1994 |
| JP | H07-049569 A | 2/1995 |
| JP | H09-054437 A | 2/1997 |
| JP | 2000-187330 A | 7/2000 |
| JP | 2004-138758 A | 5/2004 |
| JP | 2004-309777 A | 11/2004 |
| JP | 3939437 B2 | 7/2007 |
| JP | 2007-206425 A | 8/2007 |
| JP | 2009-063824 A | 3/2009 |
| JP | 2013-064978 A | 4/2013 |
| JP | 2013-080203 A | 5/2013 |
| JP | 2015-232607 A | 12/2015 |
| KR | 10-0185994 B1 | 4/1999 |
| KR | 10-2000-0029118 A | 5/2000 |
| KR | 10-2005-0058203 A | 6/2005 |
| KR | 10-2005-0073568 A | 7/2005 |
| KR | 10-2009-0026077 A | 3/2009 |
| KR | 10-2011-0046762 A | 5/2011 |
| KR | 10-2012-0030994 A | 3/2012 |
| KR | 10-2013-0032257 A | 4/2013 |
| KR | 10-1491975 B1 | 2/2015 |
| KR | 10-2015-0145713 A | 12/2015 |
| TW | 201627456 A | 8/2016 |
| TW | 201700468 A | 1/2017 |
| WO | 2016-203890 A1 | 12/2016 |

\* cited by examiner

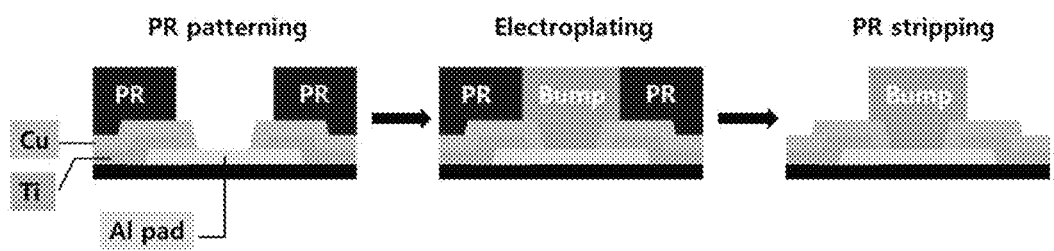

POSITIVE-WORKING PHOTORESIST COMPOSITION, PATTERN PRODUCED THEREFROM, AND METHOD FOR PRODUCING PATTERN

CROSS-REFERENCE TO RELATED APPLICATION(S)

This application is a 35 U.S.C. 371 National Phase Entry Application from PCT/KR2018/008431, filed Jul. 25, 2018, which claims priority to and the benefits of Korean Patent Application No. 10-2017-0097280 filed with the Korean Intellectual Property Office on Jul. 31, 2017, the disclosure of which are incorporated herein by reference in their entirety.

The present invention relates to a positive photoresist composition for forming a thick film, a pattern formed therefrom, and a method for producing a pattern.

TECHNICAL FIELD

BACKGROUND ART

Recently, as semiconductor packages have been converted to wafer-level flip chips, it has become possible to increase the signal transmission speed and reduce the volume of packaging, compared to conventional wire-bonded packages. Such flip chip packages are processed by using solder bumps or fillers instead of the conventional wire bonding in metal pads on semiconductor chips.

However, for flip-chip packaging using a solder bump, a photoresist for forming a thick film with a thickness of about 50 μm is required. In addition, such a photoresist is required to have strong resistance to plating solutions when growing solder bumps or fillers with electrolytic plating, and particularly, straightness of a pattern is required.

The solder bump of thick-film formation requires a pattern with a size from about 20 μm to about 100 μm depending on its application. In order to form such a thick film pattern, exposures using mixed lights or an i-line stepper are applied. At this time, an excessive amount of exposure energy is required for thick film patterning. For this reason, it is necessary to apply a dissolution inhibitor for improving the sensitivity while maintaining the film retention ratio of the photoresist applied to such process.

In order to improve the sensitivity, conventionally, polynuclear phenol compounds as a dissolution inhibitor have been conventionally protected with acetal, t-BOC, or t-butyl ester groups and used. However, since these compounds are low-molecular substances, there was a problem that the thermal stability of the photoresist compositions containing them is lowered, and they were not compatible with the resin. Further, there was a problem that the plating resistance is poor in the plating process using said composition and thus foreign matters are formed on the bumps.

DETAILED DESCRIPTION OF THE INVENTION

Technical Problem

It is an object of the present invention to provide a positive photoresist composition having excellent storage stability, sensitivity, developing properties, plating resistance, and heat resistance.

It is another object of the present invention to provide a thick film photoresist pattern produced from the composition, and a method for producing the pattern.

Technical Solution

In order to achieve the objects above, an embodiment of the present invention provides a positive photoresist composition including: a binder resin including a polymer resin in which an alkali-soluble functional group is introduced into a repeating unit, and an acrylate-based resin; an oligomer compound in which at least one protecting group selected from the group consisting of acetal, tert-butyloxycarbonyl, and t-butyl ester is introduced into the functional group, and which includes the same repeating unit as in the polymer resin or the acrylate-based resin; and a photoacid generator.

According to another embodiment of the present invention, a photoresist pattern produced from the positive photoresist composition is provided.

According to still another embodiment of the present invention, a method for producing a photoresist pattern using the positive photoresist composition may be provided.

Hereinafter, a positive photoresist composition according to a specific embodiment of the present invention, a photoresist pattern produced from the composition, and a method for producing the pattern will be described in more detail.

Positive Photoresist Composition

The present inventors found that when a specific dissolution inhibitor in the form of an oligomer having the same repeating unit structure as the resin contained in the photoresist composition is applied to said composition, the photoresist composition can increase solubility in an alkali developing solution by being dissociated by an acid, have excellent compatibility with the resin, and improve the thermal stability. In addition, it has been found that the above-mentioned photoresist composition is excellent in terms of elution preventing property of the plating solution under plating conditions. The present invention has been completed on the basis of such findings.

Specifically, the positive photoresist composition according to an embodiment of the present invention may include: a binder resin including a polymer resin in which an alkali-soluble functional group is introduced into a repeating unit, and an acrylate-based resin; an oligomer compound in which at least one protecting group selected from the group consisting of acetal, tert-butyloxycarbonyl, and t-butyl ester is introduced into the functional group, and which includes the same repeating unit as the polymer resin or the acrylate-based resin; and a photoacid generator.

The binder resin according to an embodiment of the present invention may include a polymer resin in which an alkali-soluble functional group is introduced into a repeating unit, and an acrylate-based resin.

The polymer resin in which the alkali-soluble functional group is introduced into the repeating unit may be at least one selected from the group consisting of acrylic resin, novolac resin, and polyhydroxystyrene resin. Meanwhile, the acrylic resin, novolac resin, and polyhydroxystyrene resin are not particularly limited as long as they are generally used in the technical field to which the present invention belongs.

On the other hand, the alkali-soluble functional group introduced into the polymer resin may be a hydroxyl group or a carboxylic acid.

The acrylate-based resin is contained as a binder resin in the positive photoresist composition, and may include a monomer having a hydrophilic moiety for the purpose of preventing wettability with a plating solution or a developing solution, adhesion to a substrate, and cracking. The acrylate-based resin may also include a hydrophobic, bulky monomer capable of imparting plating resistance in order to prevent cracking or swelling from occurring in the photoresist pattern during plating. In addition, the acrylate-based resin may include a monomer containing an acid or a hydroxyl group in order to adjust sensitivity and developing speed.

The acrylate-based resin may include: 30% to 60% by weight of a functional group dissociated by an acid; 10% to 50% by weight of a hydrophilic monomer; 10% to 50% by weight of a hydrophobic bulky monomer; and 5% to 20% by weight of a monomer having an acid (ACID) or hydroxyl group (OH), based on the total weight of the resin. When the above-mentioned components are contained within the above-mentioned weight ranges, not only does it have excellent sensitivity and developing property and improves coating properties such as cracks, but it also provides an effect of improving the plating resistance, which is suitable for achieving the object of the present invention.

More specifically, the acrylate-based resin may include an acrylic resin containing at least one repeating unit selected from the following Chemical Formulas 13 and 14.

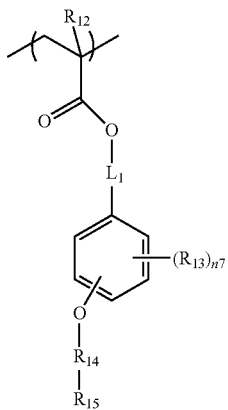

[Chemical Formula 13]

In Chemical Formula 13, $R_{12}$ and $R_{13}$ are each independently hydrogen, a substituted or unsubstituted alkyl having 1 to 60 carbon atoms, a substituted or unsubstituted cycloalkyl having 3 to 60 carbon atoms, a substituted or unsubstituted aryl having 6 to 60 carbon atoms, or a substituted or unsubstituted heteroaryl having 2 to 60 carbon atoms and containing at least one heteroatom selected from the group consisting of N, O, and S;

$n_7$ is an integer of 0 to 3;

$R_{14}$ is a linear or branched $C_2$-$C_8$ alkylene;

$R_{15}$ is a vinyl group or a (meth)acrylate group; and $L_1$ is a direct bond, an alkylene having 1 to 20 carbon atoms, a substituted or unsubstituted arylene having 6 to 60 carbon atoms, or a heteroarylene having 2 to 60 carbon atoms and containing at least one heteroatom selected from the group consisting of N, O, S, and Si.

The repeating unit of Chemical Formula 13 may be repeated 1 to 1000 times.

Specifically, $R_{14}$ may be a branched alkylene having 3 to 6 carbon atoms.

Specifically, $R_{15}$ may be a vinyl group.

Meanwhile, based on the total amount of the acrylate-based resin, the content of the repeating unit represented by Chemical Formula 13 is 10% to 90% by weight, 15% to 70% by weight, 20% to 60% by weight, or 20% to 50% by weight. When the content of the repeating unit represented by Chemical Formula 13 is less than 10% by weight, the development speed of the developing solution becomes slow, and when the content exceeds 90% by weight, the film retention ratio of the non-exposed region after development is too low, and the resistance to the plating solution may be lowered.

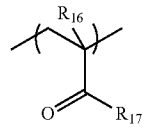

[Chemical Formula 14]

In Chemical Formula 14, $R_{16}$ is hydrogen, a substituted or unsubstituted alkyl having 1 to 60 carbon atoms, a substituted or unsubstituted cycloalkyl having 3 to 60 carbon atoms, a substituted or unsubstituted aryl having 6 to 60 carbon atoms, or a substituted or unsubstituted heteroaryl having 2 to 60 carbon atoms and containing at least one heteroatom selected from the group consisting of N, O, and S;

$R_{17}$ is one or more functional groups selected from the group consisting of an acetal group, a ketal group, a tertiary-alkyl group having 4 to 20 carbon atoms, a tertiary-alkyloxycarbonyl group having 4 to 20 carbon atoms, an isobornyl group, and an adamantyl group.

Meanwhile, according to an embodiment of the present invention, the repeating unit of Chemical Formula 13 may be represented by the following Chemical Formula 15.

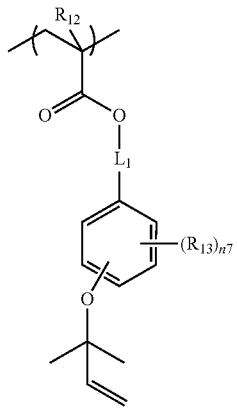

[Chemical Formula 15]

In Chemical Formula 15, $R_{12}$, $R_{13}$, $n_7$, and $L_1$ are as defined in Chemical Formula 13.

Meanwhile, the acrylate-based resin according to an embodiment of the present invention may further include an acrylic resin containing a repeating unit of the following Chemical Formula 16.

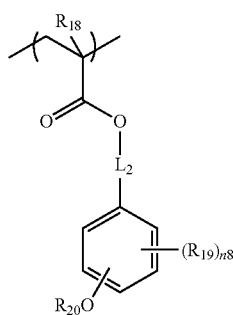

[Chemical Formula 16]

In Chemical Formula 16, $R_{18}$ and $R_{19}$ are each independently hydrogen, a substituted or unsubstituted alkyl having 1 to 60 carbon atoms, a substituted or unsubstituted cycloalkyl having 3 to 60 carbon atoms, a substituted or unsubstituted aryl having 6 to 60 carbon atoms, or a substituted or unsubstituted heteroaryl having 2 to 60 carbon atoms and containing at least one heteroatom selected from the group consisting of N, O, and S;

$n_8$ is an integer of 0 to 3;

$L_2$ is a direct bond, an alkylene having 1 to 20 carbon atoms, a substituted or unsubstituted arylene having 6 to 60 carbon atoms, or a heteroarylene having 2 to 60 carbon atoms and containing at least one heteroatom selected from the group consisting of N, O, S, and Si; and $R_{20}$ is a substituted or unsubstituted alkyl having 1 to 60 carbon atoms, a substituted or unsubstituted carbonyl having 1 to 60 carbon atoms, a substituted or unsubstituted cycloalkyl having 3 to 30 carbon atoms, a substituted or unsubstituted heterocycloalkyl having 2 to 60 carbon atoms and containing at least one heteroatom selected from the group consisting of N, O, and S, a substituted or unsubstituted aryl having 6 to 60 carbon atoms, or a substituted or unsubstituted heteroaryl having 2 to 60 carbon atoms and containing at least one heteroatom selected from the group consisting of N, O, and S.

The repeating unit of Chemical Formula 16 may be repeated 1 to 1000 times.

Based on the total amount of the acrylate resin, the content of the repeating unit represented by Chemical Formula 16 may be 10% to 40% by weight, 15% to 30% by weight, or 15% to 20% by weight. When the content of the repeating unit represented by Chemical Formula 16 is less than 10% by weight, the sensitivity may be lowered. When the content is more than 40% by weight, the storage stability may be deteriorated or the resistance to the plating solution may be deteriorated.

Meanwhile, the acrylate-based resin may further include an acrylic resin containing a repeating unit represented by the following Chemical Formula 17.

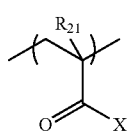

[Chemical Formula 17]

In Chemical Formula 17, $R_{21}$ is a substituted or unsubstituted alkyl having 1 to 60 carbon atoms, a substituted or unsubstituted cycloalkyl having 3 to 60 carbon atoms, a substituted or unsubstituted aryl having 6 to 60 carbon atoms, or a substituted or unsubstituted heteroaryl having 2 to 60 carbon atoms and containing at least one heteroatom selected from the group consisting of N, O, and S; and X is —OH.

The repeating unit of Chemical Formula 17 may be repeated 1 to 1000 times. For example, the repeating unit of Chemical Formula 17 has an acid group. Since the acrylic resin contained in the photoresist composition according to an embodiment of the present invention includes the repeating unit of Chemical Formula 17, the sensitivity can be improved, and the development speed can be easily adjusted. The repeating unit of Chemical Formula 17 may be at least one selected from the group consisting of methacrylic acid, acrylic acid, crotonic acid, itaconic acid, maleic acid, fumaric acid, citraconic acid, and mesaconic acid.

Based on the total amount of the acrylate-based resin, the content of the repeating unit represented by Chemical Formula 17 may be 5% to 20% by weight, 7% to 15% by weight, or 10% to 15% by weight. When the content of the repeating unit represented by Chemical Formula 17 is less than 5% by weight, the sensitivity may be lowered, and when the content is more than 20% by weight, it may become difficult to control the developing speed.

Meanwhile, the acrylate-based resin may further include an acrylic resin containing a repeating unit represented by the following Chemical Formula 18.

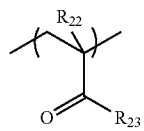

[Chemical Formula 18]

In Chemical Formula 18, $R_{22}$ is hydrogen, a substituted or unsubstituted alkyl having 1 to 60 carbon atoms, a substituted or unsubstituted cycloalkyl having 3 to 60 carbon atoms, a substituted or unsubstituted aryl having 6 to 60 carbon atoms, or a substituted or unsubstituted heteroaryl having 2 to 60 carbon atoms and containing at least one heteroatom selected from the group consisting of N, O, and S; and $R_{23}$ may be an alkyl having 1 to 5 carbon atoms and substituted with a hydrophilic group, a carbonyl having 1 to 5 carbon atoms and substituted or unsubstituted with a hydrophilic group, an ether having 1 to 3 carbon atoms and substituted or unsubstituted with a hydrophilic group, a cycloalkyl having 3 to 6 carbon atoms and substituted with a hydrophilic group, a heterocycloalkyl having 2 to 6 carbon atoms and containing at least one heteroatom selected from the group consisting of N, O, and S and substituted with a hydrophilic group, a benzene substituted with a hydrophilic group, or a heteroaryl having 2 to 5 carbon atoms and containing at least one heteroatom selected from the group consisting of N, O, and S and substituted with a hydrophilic group.

The repeating unit of Chemical Formula 18 may be repeated 1 to 1000 times.

The repeating unit of Chemical Formula 18 has hydrophilicity. Since the acrylate-based resin contained in the photoresist composition according to an embodiment of the present invention includes the repeating unit of Chemical Formula 18, it improves wettability to a plating solution or a developing solution, and adhesion to a substrate, and provides an effect of preventing cracking of the photoresist pattern.

The repeating unit of Chemical Formula 18 is, for example, at least one selected from the group consisting of ethylene glycol methyl ether, (meth)acrylate, 2-methoxyethyl methacrylate, 2-hydroxyethyl methacrylate, 2-hydroxypropyl methacrylate), 2-hydroxybutyl methacrylate, methoxypolyethylene glycol methacrylate, polyethyelene glycol methacrylate, and polypropylene glycol methacrylate.

Based on the total amount of the acrylate-based resin, the content of the repeating unit represented by Chemical Formula 18 may be 10% to 50% by weight, 15% to 40% by weight, or 20% to 25% by weight. If the content of the repeating unit represented by Chemical Formula 18 is less than 10% by weight, the sensitivity may be lowered. If the content is more than 50% by weight, resistance to the plating solution may be lowered or it may become difficult to control the developing speed.

Meanwhile, the acrylate-based resin may further include an acrylic resin containing a repeating unit represented by the following Chemical Formula 19.

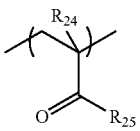

[Chemical Formula 19]

In Chemical Formula 19, $R_{24}$ is hydrogen, a substituted or unsubstituted alkyl having 1 to 60 carbon atoms, a substituted or unsubstituted cycloalkyl having 3 to 60 carbon atoms, a substituted or unsubstituted aryl having 6 to 60 carbon atoms, or a substituted or unsubstituted heteroaryl having 2 to 60 carbon atoms and containing at least one heteroatom selected from the group consisting of N, O, and S; and $R_{25}$ is a substituted or unsubstituted alkyl having 20 to 60 carbon atoms, a cycloalkyl having 5 to 60 carbon atoms and substituted or unsubstituted with an alkyl having 1 to 5 carbon atoms, or an aryl having 6 to 60 carbon atoms and substituted or unsubstituted with an alkyl having 1 to 5 carbon atoms.

The repeating unit of Chemical Formula 19 may be repeated 1 to 1000 times. The repeating unit of Chemical Formula 19 has hydrophobicity. Since the acrylate-based resin contained in the photoresist composition according to an embodiment of the present invention includes the repeating unit of Chemical Formula 19, it is possible to improve the resistance to the plating solution and to prevent a crack or a swelling phenomenon which occurs in the photoresist pattern upon plating.

The repeating unit of Chemical Formula 19 may be, for example, at least one selected from the group consisting of cyclohexyl (meth)acrylate, 1-methylcyclopentyl (meth)acrylate, 1-ethylcyclopentyl (meth)acrylate, 1-ethylcyclohexyl (meth)acrylate, 1-ethylcycloheptyl (meth)acrylate, 1-ethylcyclooctyl (meth)acrylate, 1-ethylcyclodecyl (meth)acrylate, 1-ethylcyclododecyl (meth)acrylate, 1-butylcyclohexyl (meth)acrylate, 1-isopropylcycloheptyl (meth)acrylate, 2,5 -dimethyl-1-methylcyclohexyl (meth)acrylate, dicyclopentanyl methacrylate, dicyclopentenyl methacrylate, isobornyl methacrylate), benzyl methacrylate, and phenoxyethyl methacrylate.

Based on the total amount of the acrylate-based resin, the content of the repeating unit represented by Chemical Formula 19 may be 10% to 50% by weight, 15% to 40% by weight, or 20% to 25% by weight. When the content of the repeating unit represented by Chemical Formula 19 is less than 10% by weight, the resistance to the plating solution may be lowered, and when the content is more than 50% by weight, the sensitivity may be decreased or it may become difficult to control the developing speed.

According to another embodiment of the present invention, the acrylate-based resin may include at least one selected from the group consisting of at least one repeating unit selected among Chemical Formulas 13 and 14; and the repeating units of Chemical Formulas 15 to 19. In this case, the content of the at least one repeating unit selected among Chemical Formulas 13 and 14 may be 10% to 90% by weight, 15% to 70% by weight, 20% to 60% by weight, or 20% to 50% by weight, based on the total amount of the acrylate-based resin.

The acrylate-based resin contained in the positive photoresist composition according to an embodiment of the present invention may be contained in an amount of 10% to 80% by weight, 20% to 75% by weight, 30% to 70% by weight, or 40% to 65% by weight, based on the total weight of the positive photoresist composition. When the content of the acrylate-based resin is less than 10% by weight, the viscosity of the composition is too low and the adhesion with the substrate is lowered, which may make it difficult to form a thick film photoresist layer. When the content is more than 80% by weight, the viscosity of the composition becomes higher than necessary, which makes it difficult to make coating with a uniform thickness, and it is difficult to realize smooth expression, and further there is a problem in forming a resist layer having a desired thickness.

The acrylate-based resin according to one embodiment of the present invention having the above-mentioned features may have a weight average molecular weight in a range of 20,000 to 400,000, 50,000 to 200,000, or 80,000 to 150,000. When the weight average molecular weight is too low, i.e., less than 10,000, there is a problem that the film properties are deteriorated. When it exceeds 300,000, a problem can occur that the solubility in the developing solution is lowered.

By controlling the weight average molecular weight as described above, the thick photoresist layer can maintain sufficient strength without deteriorating peel properties with supports, and also swelling of profiles in plating, and generation of cracks can be prevented.

Herein, the weight average molecular weight means a weight average molecular weight in terms of polystyrene, measured by the GPC method, and the unit may be g/mol. In the process of measuring the weight average molecular weight in terms of polystyrene by GPC, commonly known analysis equipment, detectors such as a refractive index detector, etc., and columns for analysis may be used, and commonly applied temperature conditions, solvents, and flow rates may be applied. Specific examples of the measurement conditions may include a temperature of 30° C., a chloroform solvent, and a flow rate of 1 mL/min.

As described above, the binder resin may be, for example, a mixture of a novolac resin and the acrylate-based resin, and it may be a mixture of a polyhydroxystyrene resin and the acrylate-based resin. The binder resin may be in the form of a mixture of a novolac resin, a polyhydroxystyrene resin, and the acrylate-based resin.

Meanwhile, the oligomer compound can be contained in the positive photoresist composition and can function as a dissolution inhibitor. The oligomer compound may include the same repeating unit as the polymer resin or the acrylate-based resin.

Specifically, since the oligomer compound according to an embodiment of the present invention includes the same repeating unit as the polymer resin or the acrylate resin, the compatibility with the binder resin is improved. In addition, since the oligomer compound has the same repeating unit as the resin, it has a similar glass transition temperature (Tg) value to that of the resin. Thereby, excellent heat resistance can be ensured and advantageous properties can be obtained in the step of raising the temperature before and after exposure.

According to one embodiment of the present invention, the weight average molecular weight of the oligomer compound may have a value in the range of 1500 to 5000, specifically 1500 to 3000. On the other hand, the weight average molecular weight of the polymer resin or the acrylate resin, which is included as the binder resin and which has the same repeating unit as the oligomer compound, may be in the range of 2 to 100 times the weight average molecular weight of the oligomer compound. Since the oligomer compound has a weight average molecular weight range as described above, unlike the dissolution inhibitor of a low molecular weight form according to the prior art, excellent properties can be secured in terms of the prevention of elution of the photoresist composition in the plating solution.

Meanwhile, the oligomer compound may include at least one functional group, and the functional group may have a form in which one or more protecting groups are introduced.

The protecting group may be, for example, at least one selected from the group consisting of acetal, tert-butyloxycarbonyl, and t-butyl ester.

Specifically, the repeating units contained in the oligomer compound according to one embodiment of the present invention may be at least one of the following Chemical Formulas 1, 2, and 3.

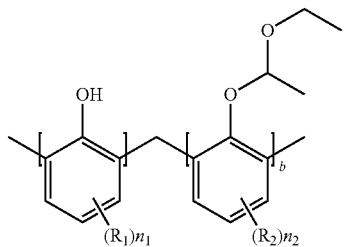

[Chemical Formula 1]

In Chemical Formula 1, $R_1$ and $R_2$ are hydrogen, a halogen, or an aliphatic group having 1 to 10 carbon atoms;

$n_1$ and $n_2$ are each an integer, where $0 \leq n_1 \leq 3$ and $0 \leq n_2 \leq 3$; and a and b are each an integer, where $0 < a \leq 80$ and $20 \leq b \leq 50$.

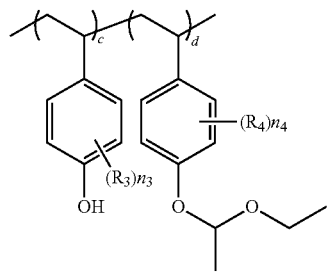

[Chemical Formula 2]

In Chemical Formula 2, $R_3$ and $R_4$ are hydrogen, a halogen, or an aliphatic group having 1 to 10 carbon atoms;

$n_3$ and $n_4$ are each an integer, where $0 \leq n_3 \leq 4$ and $0 \leq n_4 \leq 4$; and c and d are each an integer, where $0 < c \leq 80$ and $20 \leq d \leq 50$.

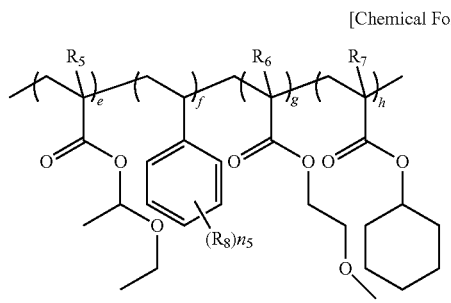

[Chemical Formula 3]

In Chemical Formula 3, $R_5$, $R_6$, $R_7$, and $R_8$ are hydrogen, a halogen, or an aliphatic group having 1 to 10 carbon atoms;

$n_5$ is an integer, where $0 \leq n_5 \leq 5$; and e, f, g, and h are each independently an integer of greater than 0 and 50 or less.

Further, according to an embodiment of the present invention, a chain transfer agent represented by the following Chemical Formula 4 may be additionally introduced to the end of the repeating unit contained in the oligomer compound.

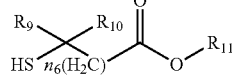

[Chemical Formula 4]

In Chemical Formula 4, $R_9$, $R_{10}$, and $R_{11}$ are each independently hydrogen, a halogen, or an aliphatic group having 1 to 10 carbon atoms, and $n_6$ is an integer, were $1 \leq n_6 \leq 20$.

Since the chain transfer agent is introduced to the end of the repeating unit contained in the oligomer compound, it serves to control the size of the molecular weight or the degree of polymerization, differently from the monomer which can affect the physical properties. Therefore, it is easier to adjust the molecular weight of the oligomer compound while the influence on the physical properties is relatively small. Thereby, the effect of further improving the compatibility with the resin used is exhibited.

In particular, when the chain transfer agent is introduced in the range of 5% to 15% by weight, specifically about 10% by weight, based on the total weight of the oligomer compound, it is possible to further facilitate adjustment of the molecular weight of the oligomer compound, for example, to provide an effect of increasing the developing speed, while reducing the influence on the physical properties of the polymer.

The chain transfer agent according to an embodiment of the present invention may be 3-mercapto propionic acid.

Meanwhile, the oligomer compound contained in the photoresist composition according to an embodiment of the present invention may be represented by the following Chemical Formula 5.

[Chemical Formula 5]

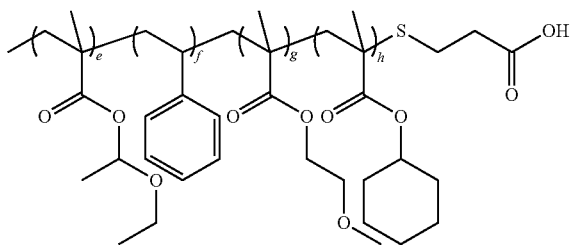

Herein, e, f, g, and h are each independently an integer of more than 0 and 50 or less.

Meanwhile, the positive photoresist composition according to an embodiment of the present invention may include a photoacid generator. Such photoacid generator may include onium salts such as iodonium salts, sulfonium salts, diazonium salts, ammonium salts, and pyridinium salts; halogen group-containing compounds such as haloalkyl group-containing hydrocarbon compounds and haloalkyl group-containing heterocyclic compounds (halomethyltriazine derivatives, etc.); diazo ketone compounds such as 1,3-diketo-2-diazo compounds, diazobenzoquinone compounds, and diazonaphthoquinone compounds; sulfone compounds such as β-ketosulfone and β-sulfonyl sulfone; sulfonic acid compounds such as alkyl sulfonate, haloalkyl sulfonate, aryl sulfonate, and imino sulfonate; and naphthalimide compounds such as N-(trifluoromethylsulfonyloxy)-1,8-naphthalimide, N-(p-toluenesulfonyloxy)-1,8-naphthalimide, N-(methylsulfonyloxy)-1,8-naphthalimide, and N-(camphorsulfonyloxy)-1,8-naphthalimide. These compounds may be used singly or as a mixture of two or more.

Specifically, the photoacid generator may be, for example, at least one selected from the group consisting of triarylsulfonium salts, diaryliodonium salts, sulfonate compounds, triphenylsulfonium triflate, triphenylsulfonium antimonate, diphenyliodonium triflate, diphenyliodonium antimonate, methoxydiphenyliodonium triflate, di-t-butyliodonium triflate, 2,6-dinitrobenzyl sulfonate, pyrogallol tris (alkylsulfonate), and succinimidyl triflate.

Meantime, the positive photoresist composition may further include at least one selected from the group consisting of an acid diffusion control agent, a corrosion inhibitor, and a solvent.

In order to improve the photoresist pattern configuration, the post-exposure stability, and the like, the acid diffusion control agent may be further included. The acid diffusion control agent may be, for example, at least one selected from the group consisting of triethylamine, tripropyl amine, tribenzyl amine, trihydroxyethyl amine, and ethylene diamine.

The solvent may be included for controlling the viscosity of the photoresist composition. The solvent may be ketones such as acetone, methyl ethyl ketone, cyclohexanone, methyl isoamyl ketone, and 2-heptanone; polyhydric alcohols such as monomethyl ether, monoethyl ether, monopropyl ether, monobutyl ether, and a monophenyl ether of ethylene glycol, ethylene glycol monoacetate, diethylene glycol monoacetate, propylene glycol, propylene glycol monoacetate, dipropylene glycol, dipropylene glycol monoacetate, and derivatives thereof; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanoate, 3-methoxybutyl acetate, and 3-methyl-3-methoxybutyl acetate; and aromatic hydrocarbons such as toluene and xylene. These solvents may be used alone or in combination of two or more.

As described above, according to the present invention, when a specific dissolution inhibitor in the form of an oligomer having the same repeating unit structure as the resin contained in the photoresist composition is applied to said composition, the photoresist composition can increase solubility in an alkali developing solution by being dissociated by an acid, have excellent compatibility with the resin, and further improve the thermal stability. In addition, the photoresist composition is excellent in an elution preventing property of the plating solution under plating conditions. Therefore, a positive photoresist composition having excellent storage stability, sensitivity, developing properties, plating resistance, and heat resistance can be provided.

Photoresist Pattern and Production Method Thereof

In another embodiment, the present invention provides a photoresist pattern produced from the positive photoresist composition. The pattern may be a thick film having a thickness of 3 μm to 150 μm, 10 μm to 130 μm, 50 μm to 100 μm, or 60 μm to 80 μm. If the thickness of the pattern is less than 3 μm, it may be difficult to form bumps having an appropriate thickness, and if it exceeds 150 μm, it may be difficult to strip the photoresist (PR) pattern after a plating process.

In still another embodiment, the present invention provides a method for producing a photoresist pattern including: a lamination step of laminating a thick film photoresist layer including the photoresist composition on a support; an exposure step of irradiating the thick film photoresist layer with radiation including electromagnetic waves or particle beams; and a development step of developing the thick film photoresist layer after exposure to obtain a thick film resist pattern.

The support is not particularly limited, and a conventionally well-known one may be used. Illustrative examples of the support include substrates for electronic parts and those on which a predetermined wiring pattern is produced. This substrate includes, for example, a substrate made of metals such as silicon, silicon nitride, titanium, tantalum, palladium, titanium tungsten, copper, chromium, iron, aluminum, or the like, a glass substrate, and the like. As materials for a wiring pattern, copper, solder, chromium, aluminum, nickel, gold, and the like may be used.

First, in the lamination step, a thick film photoresist layer is formed by applying the photoresist composition onto a support and removing the solvent by heating (prebaking). Methods such as spin coating processes, slit coating processes, roll coating processes, screen printing processes, applicator processes, etc. can be employed for the application on the support.

Next, in the exposure step, the thick film photoresist layer thus obtained is selectively irradiated with (exposed to) radiation including electromagnetic waves or particle beams, for example, ultraviolet rays or visible rays having a wavelength of 300 to 500 nm, through a mask having a predetermined pattern.

Low pressure mercury lamps, high pressure mercury lamps, super high pressure mercury lamps, metal halide lamps, argon gas lasers, etc. can be used for the light source of the radiation. Further, the radiation may include microwaves, infrared rays, visible light, ultraviolet rays, X-rays, γ-rays, electron beams, proton beams, neutron beams, ion beams, etc. The irradiation dose of the radiation may vary depending on the constituents of the photoresist composition used herein, the film thickness of the thick photoresist layer, and the like. For example, when an ultra high-pressure mercury lamp is used, the dose is 100 to 10,000 $mJ/cm^2$.

After the exposure, diffusion of the acid is promoted through heating by conventional processes, followed by changing the alkali solubility of the thick film photoresist layer in this exposed region.

Next, in the development step, for example, a certain aqueous alkaline solution is used as a developing solution to dissolve and remove unwanted regions, whereby a predetermined thick film photoresist pattern is produced.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene, or 1,5-diazabicyclo[4.3.0]-5-nonan can be used. Also, an aqueous solution prepared by adding an adequate amount of a water-soluble organic solvent such as methanol or ethanol, to the aqueous solution of the alkali can be used as the developing solution.

The developing time may vary depending on the constituents of the photoresist composition used herein, the film thickness of the thick photoresist layer, and the like. Usually, the developing time is 1 to 30 min. The method of the development may be any one of a liquid-filling method, a dipping method, a paddle method, a spray developing method, and the like.

After the development, washing with running water for 30 to 90 seconds is followed by drying with an air gun, drying in an oven, or the like.

A conductor such as a metal or the like is buried in a non-resist portion (namely, a portion which has been removed by the alkali developing solution) of the thus-obtained resist pattern through, for example, plating or the like, to thus form a connection terminal such as a metal post, a pump, or the like. Further, the plating method is not particularly limited and various conventionally known methods may be employed. In particular, as a plating solution, a solder plating solution, a copper plating solution, a gold plating solution, or a nickel plating solution may be preferably used. The remaining thick film resist pattern is finally removed by using a stripping solution or the like, according to a determined rule.

Advantageous Effects

According to the present invention, a positive photoresist composition having excellent storage stability, sensitivity, developing properties, plating resistance, and heat resistance can be provided.

Specifically, the photoresist composition according to the present invention can increase solubility in an alkali developing solution by being dissociated by an acid, have excellent compatibility with the resin, and further improve the thermal stability. In addition, the photoresist composition according to the present invention is excellent in an elution preventing property of the plating solution under plating conditions.

BRIEF DESCRIPTION OF DRAWING

FIG. 1 illustrates a process for forming bumps using the photoresist composition of the present invention.

DETAILED DESCRIPTION OF THE EMBODIMENTS

Since the present invention may be modified in various forms and may have several embodiments, particular embodiments will now be illustrated and described in detail below. However, it will be understood that the present invention is not limited to the particular embodiments, and the invention includes all modifications, equivalents, and alternatives falling within the scope and sprit of the present invention.

Hereinafter, the actions and effects of the present invention will be described by way of specific examples. However, these examples are given for illustrative purposes only, and they are not intended to limit the scope of the invention in any manner <Preparation of Photoresist Composition>

EXAMPLE 1

40 g of m,p-cresol novolac resin (Mw: 12,000, ADR 500 Å/s) represented by the following Chemical Formula 6 as a binder resin, 50 g of an acrylic resin (Mw: 65,000) represented by the following Chemical Formula 8; 10 g of an oligomer compound (Mw: 1500)of the following Chemical Formula 9 having a functional group protected with an acetal group as an oligomer compound, 3 g of N-(trifluoromethylsulfonyloxy)-1,8-naphthalimide as a photoacid generator, and 0.1 g of trihydroxyethylamine as a quencher were mixed, and then stirred at room temperature to prepare a homogeneous solution. Thereby, a positive photoresist composition was produced.

[Chemical Formula 6]

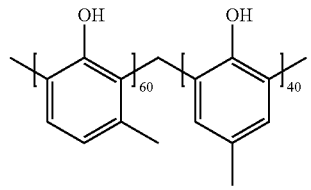

-continued

[Chemical Formula 8]

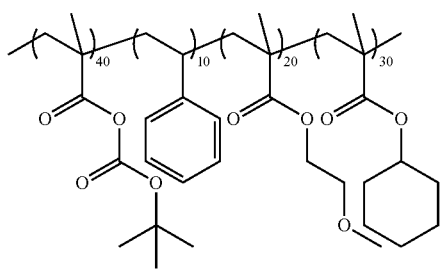

[Chemical Formula 9]

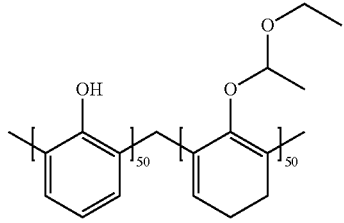

EXAMPLE 2

A positive photoresist composition was produced in the same manner as in Example 1, except that an oligomer compound (Mw: 2500) represented by Chemical Formula 11 was used as a dissolution inhibitor.

[Chemical Formula 11]

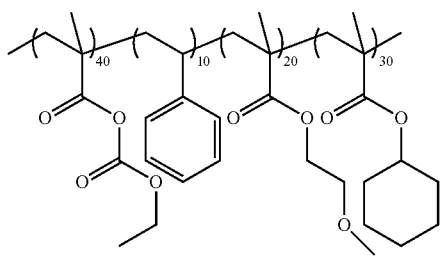

EXAMPLE 3

A positive photoresist composition was produced in the same manner as in Example 1, except that 10 g of m,p-cresol novolac resin (Mw: 12,000, ADR 500 Å/s) represented by the following Chemical Formula 6 as a binder resin, 30 g of an acetal-protected polyhydroxystyrene resin (Mw: 15,300, substitution ratio: 25%) represented by the following Chemical Formula 7, and 50 g of an acrylic resin (Mw: 65,000) represented by the following Chemical Formula 8 were used.

[Chemical Formula 6]

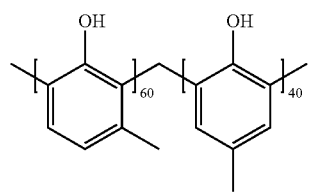

-continued

[Chemical Formula 7]

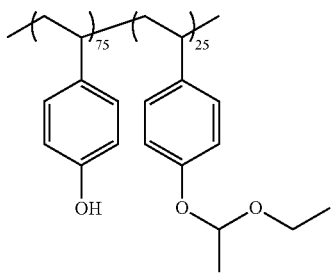

[Chemical Formula 8]

EXAMPLE 4

A positive photoresist composition was produced in the same manner as in Example 3, except that an oligomer compound (Mw: 2500, substitution ratio: 25%) represented by Chemical Formula 10 was used as a dissolution inhibitor.

[Chemical Formula 10]

EXAMPLE 5

A positive photoresist composition was produced in the same manner as in Example 4, except that 30 g of an acetal-protected polyhydroxystyrene resin (Mw: 15,300, substitution ratio: 25%) represented by the following Chemical Formula 7 and 60 g of the acrylic resin (Mw: 65,000) represented by the following Chemical Formula 8 were used as a binder resin.

[Chemical Formula 7]

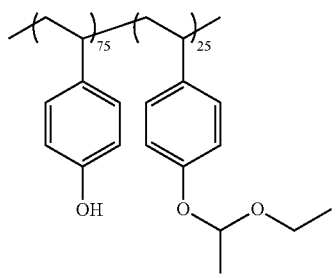

[Chemical Formula 8]

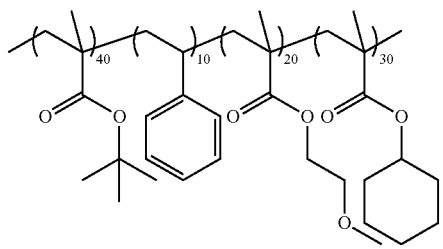

COMPARATIVE EXAMPLE 1

A positive photoresist composition was produced in the same manner as in Example 1, except that 4,4-[1-[4-[1-(1, 4-hydroxyphenyl)-1-methylethyl]phenyl]ethylidene] bisphenol (TPPA-EV) represented by the following Chemical Formula 12 was used as a dissolution inhibitor.

[Chemical Formula 12]

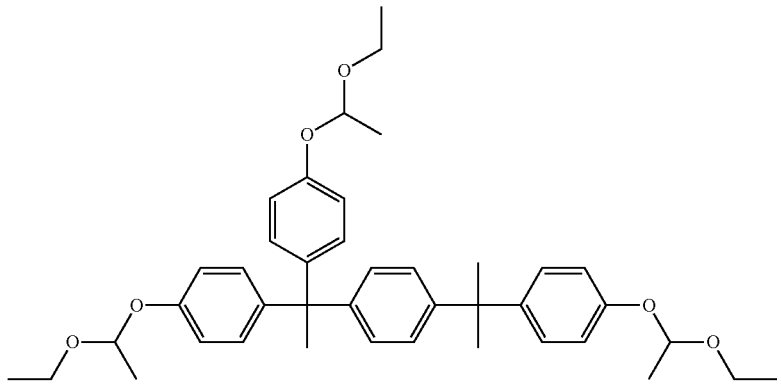

TABLE 1

|  | Example 1 | Example 2 | Example 3 | Example 4 | Example 5 | Comparative Example 1 |
| --- | --- | --- | --- | --- | --- | --- |
| Resin of Chemical Formula 6 | 40 | 40 | 10 | 10 | — | 40 |
| Resin of Chemical Formula 7 | — | — | 30 | 30 | 30 | — |
| Resin of Chemical Formula 8 | 50 | 50 | 50 | 50 | 60 | 50 |
| Oligomer of Chemical Formula 9 | 10 | — | 10 | — | — | — |
| Oligomer of Chemical Formula 10 | — | — | — | 10 | 10 | — |
| Oligomer of Chemical Formula 11 | — | 10 | — | — | — | — |
| TPPA-EVE of Chemical Formula 12 | — | — | — | — | — | 10 |
| Photoacid generator PAG | 3 | 3 | 3 | 3 | 3 | 3 |
| Quencher | 0.1 | 0.1 | 0.1 | 0.1 | 0.1 | 0.1 |

Evaluation (1) Sensitivity (Irradiation Dose)

The photoresist compositions produced in Examples 1 to 5 and Comparative Example 1 were spin-coated onto a glass substrate, dried on a hot plate at 120° C. for 2 minutes, exposed using a step mask, and then further dried on the hot plate at 100° C. for 2 minutes. The resultant material was then developed in a TMAH (tetramethylammonium hydroxide) aqueous solution. The irradiation amount with the same CD size of the step mask pattern and the photoresist (PR) pattern was evaluated as the sensitivity. The results are shown in Table 2 below.

(2) Developing Property

The photoresist compositions prepared in Examples 1 to 5 and Comparative Example 1 were spin-coated on a glass substrate, dried on a hot plate at 120° C. for 2 minutes, exposed using a step mask, and then further dried on the hot plate at 100° C. for 2 minutes. The resultant material was then developed in a TMAH (tetramethylammonium hydroxide) aqueous solution. A value obtained by subtracting the hole diameter at the bottom from the hole diameter at the top of the thick resist pattern was measured as the length of footing and used as an index of the developing property. The developing property was measured based on the following criteria, and the results are shown in Table 2 below.

⊚: Length of footing of greater than 0 nm and 200 nm or less

○: Length of footing of greater than 200 nm and 500 nm or less

Δ: Length of footing of greater than 500 nm and 1 μm or less

X: Length of footing of greater than 1 μm (3) Resistance to Plating Solution

The photoresist compositions produced in Examples 1 to 5 and Comparative Example 1 were applied on a substrate with a spin coater and then subjected to processes such as prebaking and postbaking. The resist layer thus formed was immersed in a Cu plating solution at room temperature for 2 hours, and then the change in thickness of the resist layer was observed. The thickness change rate was measured based on the following criteria, and the results are shown in Table 2 below.

⊚: Thickness change rate of 1% or less

○: Thickness change rate of greater than 1% and 5% or less

Δ: Thickness change rate of greater than 5% and 10% or less

X: Thickness change rate of greater than 10%

(4) Heat Resistance

The photoresist compositions prepared in Examples 1 to 5 and Comparative Example 1 were spin-coated on a glass substrate, dried on a hot plate at 120° C. for 2 minutes, exposed using a step mask, and then further dried on the hot plate at 100° C. for 2 minutes. Then, the coated wafer was sloped at 45° for 20 seconds and developed in a TMAH (tetramethylammonium hydroxide) aqueous solution. The heat resistance (perpendicularity of the pattern slope) was evaluated by measuring how much the produced thick film resist pattern was sloped. The results are shown in Table 2 based on the following criteria.

⊚: No slope

○: greater than 0° and 5° or less

Δ: greater than 5° and 10° or less

X: greater than 10°

TABLE 2

| | Sensitivity (dose, mJ/cm²) | Developing property | Resistance to plating liquid | Heat resistance |
|---|---|---|---|---|
| Example 1 | 420 | ○ | ○ | ⊚ |
| Example 2 | 400 | ⊚ | ⊚ | ⊚ |
| Example 3 | 360 | ⊚ | ⊚ | ⊚ |
| Example 4 | 380 | ⊚ | ⊚ | ⊚ |
| Example 5 | 340 | ⊚ | ⊚ | ⊚ |
| Comparative Example 1 | 480 | Δ | Δ | ○ |

From the results shown in Table 2, it can be seen that the photoresist compositions according to Examples 1 to 5 can obtain superior results in terms of sensitivity, developing property, resistance to plating solution, and heat resistance as compared with the photoresist composition according to Comparative Example 1.

The invention claimed is:

1. A positive photoresist composition comprising:

a binder resin comprising a polymer resin having a first repeating unit and an acrylate-based resin having a second repeating unit, the polymer resin having an alkali-soluble functional group introduced into the first repeating unit;

an oligomer compound having a functional group to which at least one protecting group is introduced; and a photoacid generator, wherein the protecting group is selected from the group of acetal, tert-butyloxycarbonyl, and t-butyl ester, wherein the oligomer compound comprises the same first repeating unit as in the polymer resin or the same second repeating unit as in the acrylate-based resin; and wherein a chain transfer agent represented by the following Chemical Formula 4 is introduced to the end of the repeating unit contained in the oligomer compound:

[Chemical Formula 4]

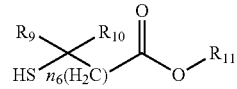

wherein, in Chemical Formula 4, $R_9$, $R_{10}$, and $R_{11}$ are each independently hydrogen, a halogen, or an aliphatic group having 1 to 10 carbon atoms, and $n_6$ is an integer, where $1 \leq n_6 \leq 20$.

2. The positive photoresist composition according to claim 1, wherein the polymer resin is at least one selected from the group of acrylic resin, novolac resin, and polyhydroxystyrene resin.

3. The positive photoresist composition according to claim 1, wherein the alkali-soluble functional group is a hydroxyl group or a carboxylic acid group.

4. The positive photoresist composition according to claim 1, wherein the oligomer compound has a weight average molecular weight in the range of 1500 to 5000.

5. The positive photoresist composition according to claim 1, wherein the first or second repeating unit contained in the oligomer compound is at least one of the following Chemical Formulae 1, 2, and 3:

[Chemical Formula 1]

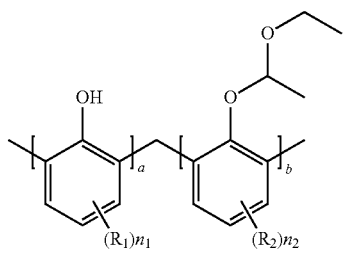

wherein, in Chemical Formula 1,
$R_1$ and $R_2$ are hydrogen, a halogen, or an aliphatic group having 1 to 10 carbon atoms,
$n_1$ and $n_2$ are each an integer, where $0 \leq n_1 \leq 3$ and $0 \leq n_2 \leq 3$, and
a and b are each an integer, where $0 < a \leq 80$ and $20 \leq b \leq 50$;

[Chemical Formula 2]

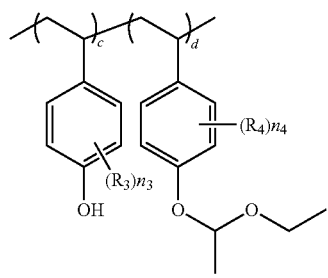

wherein, in Chemical Formula 2,
$R_3$ and $R_4$ are hydrogen, a halogen, or an aliphatic group having 1 to 10 carbon atoms,
$n_3$ and $n_4$ are each an integer, where $0 \leq n_3 \leq 4$ and $0 \leq n_4 \leq 4$, and
c and d are each an integer, where $0 < c \leq 80$ and $20 \leq d \leq 50$; and

[Chemical Formula 3]

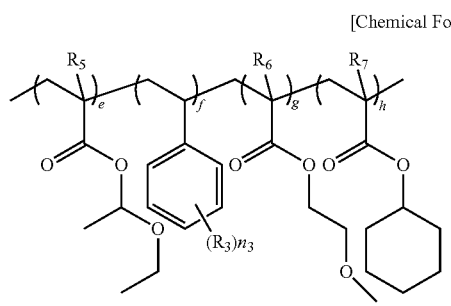

wherein, in Chemical Formula 3,
$R_5$, $R_6$, $R_7$, and $R_8$ are hydrogen, a halogen, or an aliphatic group having 1 to 10 carbon atoms,
$n_5$ is an integer, where $0 \leq n_5 \leq 5$, and
e, f, g, and h are each independently an integer of greater than 0 and 50 or less.

6. The positive photoresist composition according to claim 1, wherein the chain transfer agent is introduced in the range of 5% to 15% by weight, based on the total weight of the oligomer compound.

7. The positive photoresist composition according to claim 1, wherein the chain transfer agent is 3-mercapto propionic acid.

8. The positive photoresist composition according to claim 1, wherein the oligomer compound is represented by the following Chemical Formula 5:

[Chemical Formula 5]

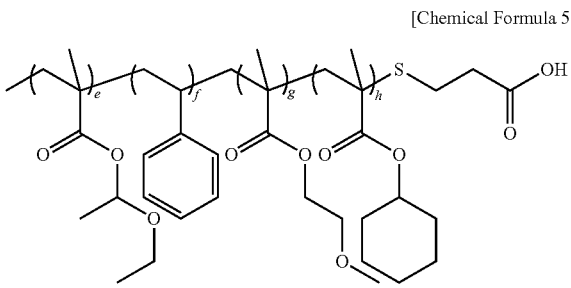

wherein e, f, g, and h are each independently an integer of more than 0 and 50 or less.

9. A photoresist pattern produced from the positive photoresist composition according to claim 1.

10. A method for producing a thick film photoresist pattern, comprising:
a lamination step of laminating a thick film photoresist layer comprising the photoresist composition of claim 1 on a support;
an exposure step of irradiating the thick film photoresist layer with radiation including electromagnetic waves or particle beams; and
a development step of developing the thick film photoresist layer after exposure to obtain the thick film photoresist pattern.

11. A positive photoresist composition comprising:
a binder resin comprising a polymer resin having a first repeating unit and an acrylate-based resin having a second repeating unit, the polymer resin having an alkali-soluble functional group introduced into the first repeating unit;
an oligomer compound having a functional group to which at least one protecting group is introduced; and
a photoacid generator,
wherein the protecting group is selected from the group of acetal, tert-butyloxycarbonyl, and t-butyl ester,
wherein the oligomer compound comprises the same first repeating unit as in the polymer resin or the same second repeating unit as in the acrylate-based resin, and
wherein the oligomer compound is represented by the following Chemical Formula 5:

[Chemical Formula 5]

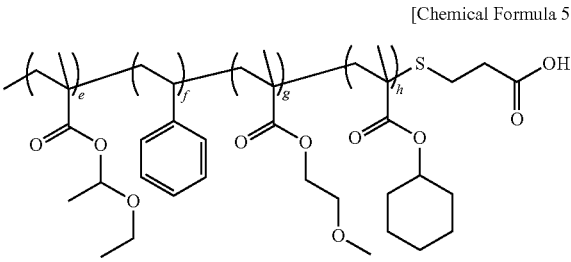

wherein e, f, g, and h are each independently an integer of more than 0 and 50 or less.

12. The positive photoresist composition according to claim 11, wherein the polymer resin is at least one selected from the group of acrylic resin, novolac resin, and polyhydroxystyrene resin.

13. The positive photoresist composition according to claim 11, wherein the alkali-soluble functional group is a hydroxyl group or a carboxylic acid group.

14. The positive photoresist composition according to claim 11, wherein the oligomer compound has a weight average molecular weight in the range of 1500 to 5000.

15. The positive photoresist composition according to claim 11, wherein a chain transfer agent represented by the following Chemical Formula 4 is introduced to the end of the repeating unit contained in the oligomer compound:

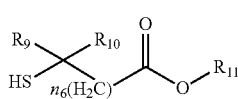

[Chemical Formula 4]

wherein, in Chemical Formula 4, $R_9$, $R_{10}$, and $R_{11}$ are each independently hydrogen, a halogen, or an aliphatic group having 1 to 10 carbon atoms, and $n_6$ is an integer, where $1 \leq n_6 \leq 20$; and wherein the chain transfer agent is introduced in the range of 5% to 15% by weight, based on the total weight of the oligomer compound.

16. The positive photoresist composition according to claim 15, wherein the chain transfer agent is 3-mercapto propionic acid.

17. A photoresist pattern produced from the positive photoresist composition according to claim 11.

18. A method for producing a thick film photoresist pattern, comprising:

a lamination step of laminating a thick film photoresist layer comprising the photoresist composition of claim 11 on a support;

an exposure step of irradiating the thick film photoresist layer with radiation including electromagnetic waves or particle beams; and a development step of developing the thick film photoresist layer after exposure to obtain the thick film photoresist pattern.

* * * * *